US009485126B2

(12) United States Patent
Jeng

(10) Patent No.: US 9,485,126 B2
(45) Date of Patent: Nov. 1, 2016

(54) SIGNAL COMBINING SYSTEM FOR CONSTANT ENVELOPE TRANSMISSION OF INFORMATION

(71) Applicant: The Boeing Company, Chicago, IL (US)

(72) Inventor: Isaac M. Jeng, Yorba Linda, CA (US)

(73) Assignee: THE BOEING COMPANY, Chicago, IL (US)

(*) Notice: Subject to any disclaimer, the term of this patent is extended or adjusted under 35 U.S.C. 154(b) by 0 days.

(21) Appl. No.: 14/465,515

(22) Filed: Aug. 21, 2014

(65) Prior Publication Data
US 2016/0056983 A1  Feb. 25, 2016

(51) Int. Cl.
  H03K 7/06    (2006.01)
  H04L 27/20   (2006.01)
  H04B 1/707   (2011.01)
  H04J 13/10   (2011.01)
  H04B 1/04    (2006.01)
  H04L 1/00    (2006.01)
  H04L 27/36   (2006.01)
  H03F 1/32    (2006.01)
  H04B 1/713   (2011.01)
  H04B 1/7143  (2011.01)

(52) U.S. Cl.
  CPC ............. *H04L 27/20* (2013.01); *H04B 1/04* (2013.01); *H04B 1/707* (2013.01); *H04J 13/10* (2013.01); *H03F 1/3247* (2013.01); *H04B 1/713* (2013.01); *H04B 1/7143* (2013.01); *H04B 2201/70706* (2013.01); *H04B 2201/70715* (2013.01); *H04L 1/0003* (2013.01); *H04L 1/0071* (2013.01); *H04L 27/368* (2013.01)

(58) Field of Classification Search
  CPC .... H04B 1/713; H04B 1/7143; H04B 1/707; H04B 1/04; H04J 13/10; H04L 1/0003; H04L 1/00741; H04L 27/368; H04L 27/20; H03F 1/3247
  USPC ................................ 375/135, 146, 295–296
  See application file for complete search history.

(56) References Cited

U.S. PATENT DOCUMENTS 5,267,271 A     11/1993  Rice
2004/0009784 A1*  1/2004  Ohkubo .............. H04W 52/143
                                                     455/522

(Continued)

OTHER PUBLICATIONS

Dafesh et al., "Phase-Optimized Constant-Envelope Transmission (POCET) Modulation Method for GNSS Signals," 22nd International Meeting of the Satellite Division of the Institute of Navigation, Sep. 2009, pp. 2860-2866.

(Continued)

*Primary Examiner* — Sam K Ahn
*Assistant Examiner* — Janice Tieu
(74) *Attorney, Agent, or Firm* — Yee & Associates, P.C.

(57) ABSTRACT

A method and apparatus for producing a transmission of constant envelope on a carrier signal. All possible combinations of all component codes for phases for producing the transmission are defined. Desired component code powers and desired intercode phases between all pairs of component codes are also defined. Still further, a portion of variables of a search process to reduce a number of variables searched by the search process is defined. Even further, deltas and weight variations for standard differences in a Jacobian matrix for use in the search process are defined. Penalty factors to evaluate an objective function of the search process are also defined. The search process is performed.

20 Claims, 9 Drawing Sheets

(56) References Cited

U.S. PATENT DOCUMENTS

2004/0208525 A1* 10/2004 Seydnejad ......... H04B 10/0775 398/33
2011/0051783 A1 3/2011 Cahn et al.

OTHER PUBLICATIONS

Dafesh et al., "Application of POCET Method to Combine GNSS Signals at Different Carrier Frequencies," International Technical Meeting of The Institute of Navigation, Jan. 2011, pp. 1201-1206.

Dafesh et al., "Receiver Compatibility of POCET Signal Combining," International Technical Meeting of the Institute of Navigation, Jan. 2011, pp. 1173-1180.

Extended European Search Report, dated Dec. 11, 2015, regarding Application No. EP15170646.2, 9 pages.

Yan et al., "Coefficients Optimization Based Quasi-constant Envelope Multiplexing Technique and Its Applications," 2014 International Technical Meeting of the Institute of Navigation, Jan. 2014, pp. 825-834.

* cited by examiner

SIGNAL COMBINING SYSTEM FOR CONSTANT ENVELOPE TRANSMISSION OF INFORMATION

BACKGROUND INFORMATION

1. Field

The present disclosure relates generally to communications and, in particular, to controlling the transmission of information on a carrier signal. Still more particularly, the present disclosure relates to a method and apparatus for producing a transmission of constant envelope on a carrier signal.

2. Background

In the field of communications, information is sometimes sent via a carrier signal. The carrier signal is a type of signal having a shape and form that is modulated to encode the information into the signal for transmission. The carrier signal has a tonal frequency known as the carrier tone. The carrier tone is not modified when information is modulated onto the carrier signal. For example, a carrier signal can be used to send information over the air or through space as an electromagnetic wave.

Today, most information sent over a carrier signal is digital information. This digital information is typically received as a sequence of bits for transmission by the carrier signal. If the information to be sent over the carrier signal is from an analog signal, the analog signal is first converted into digital information for transmission over the carrier signal. Each of the bits has a value of +1 or −1.

The information sent on a carrier signal may come from many sources. Even when the information is from one source, multiple sequences of bits of information may be sent at the same time over the carrier signal. Before a sequence of bits of information is modulated onto the carrier signal, the sequence of bits is typically first spread using a component code selected for the sequence of bits. When multiple spread sequences of bits are transmitted via a single carrier signal, a signal combining technique is typically used to combine the spread sequences of bits into a composite sequence of bits before transmission.

These component codes are sequences of chips. The chips typically have values of +1 or −1. The term "chips" was chosen to reduce confusion with the term bits used in the sequence of bits of information.

When the carrier tone of the carrier signal is modulated to transmit a composite sequence of bits of information, power efficiency of the carrier signal can be reduced. Therefore, it would be desirable to have a method and apparatus that take into account at least some of the issues discussed above, as well as other possible issues. For example, it would be desirable to have a method and apparatus that increase power efficiency of a carrier tone of a carrier signal when the carrier tone is modulated to transmit a composite sequence of bits of information.

SUMMARY

In one illustrative embodiment, a method for producing a transmission of constant envelope on a carrier signal is presented. All possible combinations of all component codes for phases for producing the transmission are defined. Desired component code powers and desired intercode phases between all pairs of component codes are also defined. Still further, a portion of variables of a search process to reduce a number of variables searched by the search process is defined. Even further, deltas and weight variations for standard differences in a Jacobian matrix for use in the search process are defined. Penalty factors to evaluate an objective function of the search process are also defined. The search process is performed.

In another illustrative embodiment, a signal combining system comprises a search process and a component code generator. The search process identifies phase values for phases for producing a transmission of information on a carrier with a constant envelope. The component code generator defines all possible combinations of all component codes for the phases. The component code generator also defines desired component code powers and desired intercode phases between all pairs of component codes. The component code generator further defines a portion of variables of the search process to reduce a number of variables searched by the search process. The component code generator still further defines deltas and weight variations for standard differences in a Jacobian matrix for use in the search process. The component code generator even further defines penalty factors to evaluate an objective function of the search process. The component code generator then uses the search process to identify the phase values.

In yet another illustrative embodiment, an apparatus comprises a search process and a component code generator. The search process identifies phase values for phases for producing a transmission of information on a carrier with a constant envelope. The component code generator defines all possible combinations of all component codes for the phases. The component code generator also defines desired component code powers and desired intercode phases between all pairs of component codes. The component code generator further defines a portion of variables of the search process to reduce a number of variables searched by the search process. The component code generator still further defines deltas and weight variations for standard differences in a Jacobian matrix for use in the search process. The component code generator even further defines penalty factors to evaluate an objective function of the search process. The component code generator then uses the search process to identify the phase values.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
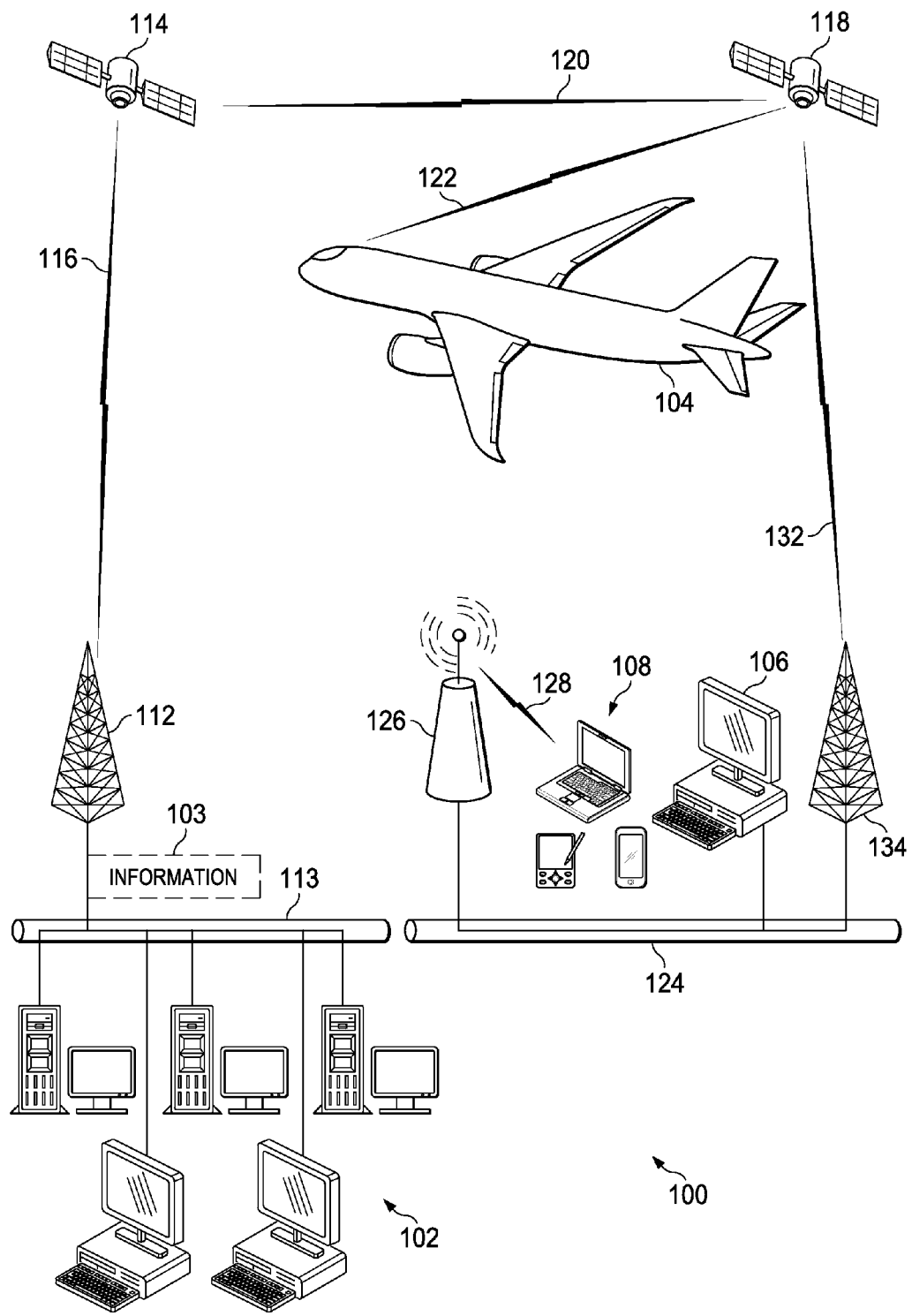
FIG. 1 is an illustration of a communications environment in accordance with an illustrative embodiment.

The illustrative embodiments recognize and take into account that a phase-optimized constant-envelope transmission (POCET) method has been described for optimizing the combining of multiple sequences of bits for a carrier signal. However, this method requires use of a search process that has a number of variables in the simultaneous equations of the search process that increases the time and processing resources needed to obtain a solution. As a result, the search process may take more time and resources to obtain a solution than desired.

In the illustrative embodiments, the method and apparatus combine a plurality of binary sequences into one resultant sequence for transmission. Each of the binary sequences is referred to as a component binary sequence and the resultant sequence is termed the composite sequence. In the illustrative embodiments, each component binary sequence contains a series of bits, chips, or both that have values of +1 or −1 and has a user-specified minimum power for the component binary sequence to be recovered through a receiver. The composite sequence represents all the component binary sequences. The composite sequence includes an amplitude and a phase at any given time.

In order to power-efficiently represent the plural of component binary sequences, the different illustrative embodiments provide the minimal required constant amplitude and a number of phases depending on the number of component binary sequences to be combined. The number of phases is $2^N$ where N is the number of component binary sequences. Further, the illustrative embodiments optimize phases for the composite sequence such that the composite sequence received by the receiver allows the receiver to recover each component binary sequence and its associated power via correlation, as if the component binary sequences are transmitted alone without being combined.

Thus, the illustrative embodiments provide a method and apparatus for producing a transmission of constant envelope on a carrier signal. In one illustrative embodiment, an apparatus comprises a search process and a component code generator. The search process identifies phase values for phases for producing a transmission of information on a carrier with a constant envelope. The constant envelope is the circle on which the phases representing the composite sequence reside. The radius of the constant envelope is the magnitude of the transmission amplitude of the composite sequence.

The component code generator defines all possible combinations of all component codes for the phases. The component code generator also defines desired component code powers and desired intercode phases between all pairs of component codes. The component code generator further defines a portion of variables of the search process to reduce a number of variables searched by the search process. The component code generator still further defines deltas and weight variations for standard differences in a Jacobian matrix for use in the search process. The component code generator even further defines penalty factors to evaluate the objective function of the search process. The component code generator then uses the search system to perform the search process to identify the phase values.

With reference now to the figures, and in particular, with reference to FIG. 1, an illustration of a communications environment is depicted in accordance with an illustrative embodiment. In this example, communications environment 100 comprises sources 102 of information 103. As depicted, sources 102 may be server computers, or other suitable types of devices in communications environment 100. For example, sources 102 may also include satellites and cellular devices. In this illustrative example, sources 102 send information 103 using components of communications environment 100.

As depicted, destinations for information 103 include at least one of aircraft 104, computer 106, portable devices 108, or other suitable types of devices in communications environment 100. For example, portions of information 103 from sources 102 may include at least one of audio-visual data, internet communications, satellite navigation data, or other suitable types of information. Portable devices 108 are at least one of laptop computers, portable digital devices, tablet computers, or other suitable types of devices for receiving the portions of information 103 from sources 102.

As used herein, the phrase "at least one of," when used with a list of items, means different combinations of one or more of the listed items may be used and only one of each item in the list may be needed. In other words, at least one of means any combination of items and number of items may be used from the list but not all of the items in the list are required. The item may be a particular object, thing, or a category.

For example, without limitation, "at least one of item A, item B, or item C" may include item A, item A and item B, or item B. This example also may include item A, item B, and item C or item B and item C. Of course, any combinations of these items may be present. In other examples, "at least one of" may be, for example, without limitation, two of item A; one of item B; and ten of item C; four of item B and seven of item C; or other suitable combinations.

As depicted, tower 112 is a component in communications environment 100 that communicates with sources 102. This communication occurs over network 113. In this illustrative example, network 113 may be a portion of the internet or any other suitable type of network.

In the illustrative example, tower 112 communicates with satellite 114 using signals 116. In this example, tower 112 generates signals 116 that include information 103 from sources 102. Tower 112 sends signals 116 to satellite 114 in this illustrative example.

As depicted, satellite 114 sends information 103 to satellite 118 over signals 120. For example, satellite 114 may generate signals 120 via a carrier signal using a signal combining system in accordance with an illustrative embodiment. In this example, the signal combining system identifies phase values for a sequence of phases for transmitting information 103 with a constant amplitude and an increase in overall power efficiency for the transmission.

In this illustrative example, the signal combining system identifies phase values from a phase table. For example, the signal combining system may receive the phase table from tower 112 or some other suitable source. In this example, tower 112 may generate the phase table using a search process. The search process identifies the phase values using an objective function and simultaneous equations. In this example, the process solves the simultaneous equations using defined variables for a portion of variables of the simultaneous equations.

This search process has advantages over the prior art. This search process is faster and uses fewer processing resources. When additional resources are available in satellites, the search process may be in the satellites too.

As depicted, satellite 114 sends information 103 to satellite 118 over signals 120. For example, satellite 114 may generate signals 120.

Also, satellite 118 sends signals 122 to aircraft 104. For example, satellite 118 may generate signals 122 as a copy of signals 120 received from satellite 114.

In this illustrative example, computer 106 is connected to network 124. Portable devices 108 use wireless networking device 126 to connect to network 124 in this illustrative example. As depicted, portable devices 108 communicate with wireless networking device 126 using signals 128. In this illustrative example, signals 128 are at least one of Wi-Fi signals, cellular network signals, or any other suitable type of signals used in wireless communications. As depicted, network 124 may be another portion of the internet or any other suitable type of network.

Satellite 118 sends signals 132 to tower 134 in this illustrative example. For example, satellite 118 may generate signals 132 as a copy of signals 120 received from satellite 114. Tower 134 is connected to network 124 in this illustrative example. As depicted, tower 134 identifies information 103 in signals 132. For example, tower 134 may extract information 103 from signals 132 using a signal de-combining system. Tower 134 sends information 103 to the destinations identified by sources 102.

The illustration of communications environment 100 in FIG. 1 is not meant to limit the manner in which other illustrative embodiments may be implemented. For example, aircraft 104, satellite 118, computer 106, portable devices 108, and tower 134 may also be a source of information. As still another example, additional satellites, towers, and sources of information may be included in communications environment 100.

Figure 2:
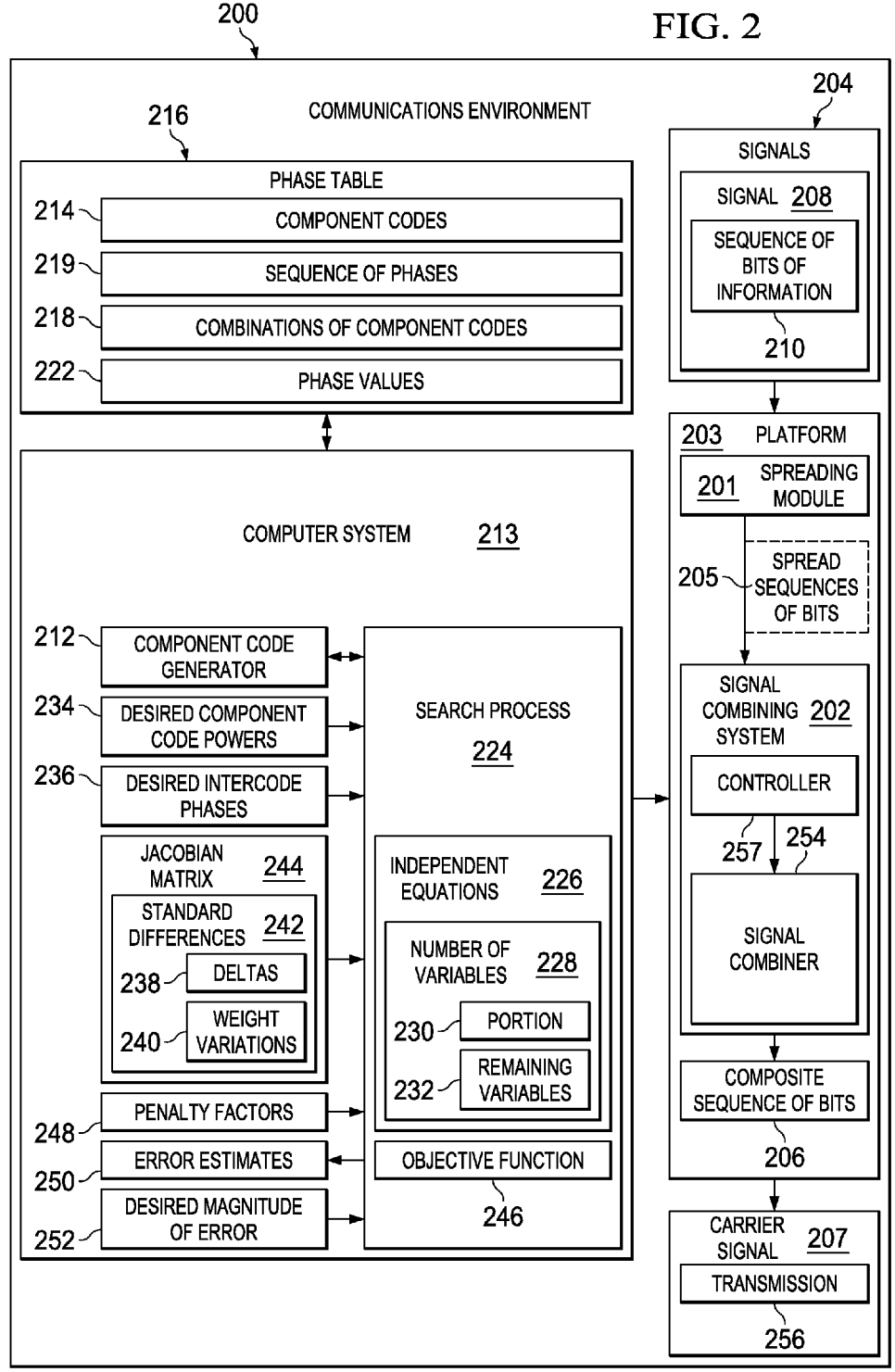
FIG. 2 is an illustration of a block diagram of a communications environment in accordance with an illustrative embodiment.

Turning next to FIG. 2, an illustration of a block diagram of a communications environment is depicted in accordance with an illustrative embodiment. Communications environment 100 in FIG. 1 is an example of one physical implementation of communications environment 200 shown in block form in this figure.

In this depicted example, communications environment 200 includes spreading module 201 and signal combining system 202 in platform 203. Spreading module 201 controls spreading of sequences of bits of information in signals 204. Signal combining system 202 controls transmission of information in signals 204 over carrier signal 207. Platform 203 is at least one of a satellite, a tower, or other suitable location for spreading module 201 or signal combining system 202 in communications environment 200.

As depicted, spreading module 201 receives signals 204. In the illustrative example, signals 204 include information from a single source or multiple sources. As depicted, spreading module 201 generates spread sequences of bits 205 by spreading sequences of bits of information received in signals 204. In this illustrative example, the spectrum of signals 204 is spread in the frequency domain. Spreading module 201 sends spread sequences of bits 205 to signal combining system 202. In this illustrative example, signal combining system 202 generates composite sequence of bits 206 by combining spread sequences of bits 205. The carrier tone of carrier signal 207 is modulated to send composite sequence of bits 206. For example, the carrier tone of carrier signal 207 may be a sine wave of a particular frequency and amplitude.

In the illustrative example, composite sequence of bits 206 represents all spread sequences of bits 205. In this example, composite sequence of bits 206 includes an amplitude and a phase at any given time.

In this illustrative example, signal 208 in signals 204 includes sequence of bits of information 210. Each bit in sequence of bits of information 210 is a value of +1 or −1 in this illustrative example. For example, sequence of bits of information 210 in signal 208 is at least one of audio-visual data, internet communications, voice communications, images, audio, programs, or other suitable types of information. As used herein, a sequence of items is a numbered list of items. For example, a sequence of four bits is a first bit, a second bit, a third bit, and a fourth bit.

As depicted, component code generator 212 in computer system 213 generates component codes 214 in phase table 216. Component code generator 212 generates a sequence of bits, chips, or both, having values +1 or −1 in some order defined by some deterministic logics used in component code generator 212. The component code is deterministic in these examples because the component code is a known sequence that appears random, and thus may be pseudo-random noise (PRN).

In this illustrative example, component codes 214 contains all of the component binary sequences to be combined in the illustrative example. Depending on the number of component binary sequences to be combined, represented as N, component codes 214 may be located in a table (2N rows by N columns) containing binary values +1 and −1.

Each column represents a component binary sequence. The purpose of "component codes 214" is to define each row of bits, chips, or both as a combination of binary values +1 and −1. The combination is a combination of component codes 218 in this example. Each combination is to be represented by a phase for transmission of the composite sequence. Hence, the composite sequence is a transmission consisting of an amplitude and sequence of phases. Each phase has a phase value. The phases and the amplitude provided using the illustrative embodiments are described herein. As depicted, component codes 214 are for spreading bits of information in signals 204.

In this illustrative example, component codes 214 are sequences of values. Component codes 214 may include at least one of four sequences of values, five sequences of values, six sequences of values, or some other suitable number of sequences of values. Component codes 214 are at least one of binary spreading codes, quadrature spreading codes, or some other suitable type of component codes. Binary spreading codes are sequences of two different values. These values may be +1 or −1. When the values of a binary spreading code are randomly selected via a deterministic process, the binary spreading code may be referred to as pseudo-random noise (PRN). Quadrature spreading codes are sequences of four different values. Spreading module 201 spreads sequences of bits of information in signals 204 using component codes 214. Signal combining system combines spread sequences of bits 205 into composite sequence of bits 206 for transmission on carrier signal 207.

For example, four different sequences of bits of information may be combined for the transmission by spreading the four different sequences of bits of information via four binary spreading codes, combining the four spread sequences of bits into composite sequence of bits 206 and placing composite sequence of bits 206 into carrier signal 207. In this example, the four different sequences of bits are spread via four different binary spreading codes, combined into composite sequence of bits 206, then modulated onto the carrier tone of carrier signal 207.

As depicted, phase table 216 includes the sequences of values of component codes 214, sequence of phases 219, combinations of component codes 218, and a sequence of phase values 222. For example, phase table 216 may have rows for sequence of phases 219 and columns for the sequences of the values of component codes and for the sequence of phase values 222.

In this illustrative example, component code generator 212 generates combinations of component codes 218 for sequence of phases 219 in phase table 216. Component code generator 212 generates combinations of component codes 218 using the sequences of values of component codes 214. As depicted, a phase in sequence of phases 219 is an identifier of a location in the sequences of values of component codes 214. A first phase in sequence of phases 219 identifies a first value for the sequences of values in component codes 214. For example, combinations of component codes 218 may be retrieved from phase table 216 for sequence of phases 219.

As depicted, search process 224 in computer system 213 identifies phase values 222 in phase table 216. In this illustrative example, the sequence of phase values 222 represent combinations of component codes 218. In this illustrative example, a phase value in the sequence of phase values 222 is a representation of a combination of component codes in combinations of component codes 218 for a phase in sequence of phases 219.

In this illustrative example, independent equations 226 in search process 224 have number of variables 228. Number of variables 228 are independent variables of independent equations 226. In this illustrative example, portion 230 of number of variables 228 are defined. The defining of portion 230 reduces remaining variables 232 in number of variables 228 minus portion 230. As depicted, search process 224 identifies phase values 222. In particular, search process 224 solves for remaining variables 232 of independent equations 226 to obtain phase values 222.

As depicted, independent equations 226 in search process 224 use desired component code powers 234, desired intercode phases 236 between all pairs of component codes 214, deltas 238 and weight variations 240 for standard differences 242 of Jacobian matrix 244. In the illustrative example, objective function 246 of search process 224 uses penalty factors 248.

In the illustrative example, desired component code powers 234 are the user-specified minimum powers for the component binary sequences that are to be recovered by the receiver via correlation. Each of the component binary sequences is to be assigned to either the x-axis or y-axis exclusively for transmission like a BPSK signal. These axes are often referred to as the real axis and imaginary axis, respectively. Alternatively, the axes may be referred to as the I channel or Q channel, respectively.

A component binary sequence sy assigned to the y-axis and another component binary sequence sx assigned to the x-axis have an inter-sequence phase relationship. The inter-sequence phase of sy with respect to sx is 90°. In this example, the inter-sequence phase is exactly the inter-axis phase of the y-axis with respect to the x-axis being 90°. This inter-sequence phase is also referred to as the intercode phase since often, a component binary sequence is also known as a component binary code or component binary spreading code.

In this illustrative example, desired component code powers 234 are minimum amounts of power required for component codes 214 at a receiving end of a transmission via carrier signal 207. The minimum amounts of power required for component codes 214 are the minimum limits on the measure of the received power of the component code at the receiving end of the transmission. For example, when the transmission includes composite sequence of bits 206 based on four different component codes for four sequences of bits of information, a receiver on the receiving end of the transmission may require a minimal amount of received power for each of the four different component codes.

In this illustrated example, deltas 238 are positive real numbers. Search process 224 approximates the first derivative of each independent equation in independent equations 226 using deltas 238. For example, if the independent equation is f(x), the first derivative of f(x) with respect to x is defined as the instantaneous slope of f(x). The instantaneous slope of f(x) is the slope of f(x) at a single point. The instantaneous slope of f(x) can be approximated using a standard difference method. The standard difference method is also known as a central difference method. The standard difference method of f(x) is $(f(x+0.5\Delta)-f(x-0.5\Delta))/\Delta$ where the symbol $\Delta$ is a delta in deltas 238. In this illustrative example, as the delta approaches zero, the approximation approaches the instantaneous slope of f(x).

As depicted, search process 224 modifies deltas 238 by weight variations 240 to calculate standard differences 242 of Jacobian matrix 244. Weight variations 240 are constant real number values slightly larger than the number 1. For example, after a first iteration of search process 224, a delta in deltas 238 is made slightly larger for the second iteration of search process 224 using a weight variation in weight variations 240. In this example, the delta is equal to the delta used in the previous iteration times the weight variation.

In this illustrative example, Jacobian matrix 244 is the matrix of all first-order partial derivatives of a vector-valued function. Vector-valued functions have one or more variables whose range is a set of multidimensional vectors. In this illustrative example, a vector is a geometric quantity having magnitude and direction. For example, a vector may be an amplitude of a signal on a sine wave of a carrier tone or a phase value used to modulate a bit of information onto a carrier signal. Search process 224 uses Jacobian matrix 244 to find some optimal values for some of remaining variables 232 of independent equations 226.

In the illustrative example, search process 224 finds values for number of variables 228 through a number of iterations. The second and subsequent iterations calculate values for number of variables 228 using respective values from the prior iteration. In order to start the first iteration, initial values for some of number of variables 228 are defined by search process 224.

For example, when there are four binary spreading codes being used, search process 224 identifies six variables in number of variables 228. In this example, the six variables include amplitude, the first, second, third, and fourth phases of sequence of phases 219, and Q value. As used herein, Q value is a real number representing a degree on the constant envelope between two phase values.

In this illustrative example, the initial value for the amplitude is the sum of desired component code powers 234 plus 0.7 dB. The initial value for the amplitude to start the first iteration of a search algorithm is the square root of initial power. The initial power is equal to 1.175×sum of desired component code powers 234. In this illustrative example, 0.7 dB corresponds to 1.175 because 10×log 10(1.175) is approximately 0.7 dB. Desired component code powers 234 is specified by at least one of an operator or other type of users of the invention.

In the illustrative example, search process 224 identifies error estimates 250 of values found for variables in number of variables 228. As depicted, search process 224 iterates until error estimates 250 are less than desired magnitude of error 252. Error estimates 250 are differences between values of number of variables 228 in a current iteration of search process 224 and values of number of variables 228 in a previous iteration. Desired magnitude of error 252 is specified by at least one of an operator or other type of users of this invention.

As depicted, signal combiner 254 modulates the carrier tone of carrier signal 207 for transmission 256. The modulation is performed under the control of controller 257. In this illustrative example, signal combiner 254 modulates the carrier tone of carrier signal 207 based on composite sequence of bits 206, the sequence of values of component codes 214, and the sequence of phase values 222.

Transmission 256 has a constant envelope for component codes 214 on carrier signal 207 in the illustrative example. An envelope is an amplitude of a signal for transmission over time. An envelope is identified as constant when the amplitude of the signal remains constant over time. An envelope for component codes 214 is signal amplitude of transmission 256 of composite sequence of bits 206 using component codes 214. The signal amplitude is the square root of signal power during transmission 256. "Signal power," as used herein, is a measure of energy of carrier signal 207 divided by the duration of time of transmission 256.

For example, an envelope for component codes 214 is identified as constant when the sequence of phase values 222 resides on a phase circle. When the constant envelope is present for a signal, an amplifier used to generate the signal may operate more efficiently than when the envelope is not constant. When the efficiency of the amplifier is improved, energy consumption by the amplifier is reduced.

Search process 224 identifies the sequence of phase values 222 using objective function 246. In this illustrative example, the sequence of phase values 222 identified by search process 224 reduces an overall amount of power used to transmit composite sequences of bits 206.

In this illustrated example, transmission 256 of composite sequences of bits 206 over the carrier tone of carrier signal 207 has constant envelope and optimized phases. Thus, the sequence of phase values 222 identified by search process 224 results in a minimal amount of power needed for transmission 256 of composite sequence of bits 206 via carrier signal 207.

In this illustrative example, component code generator 212, search process 224, and signal combiner 254 may be implemented in software, hardware, firmware or a combination thereof. When software is used, the operations performed may be implemented in program code configured to run on hardware, such as a processor unit. When firmware is used, the operations performed may be implemented in program code and data and stored in persistent memory to run on a processor unit. When hardware is employed, the hardware may include circuits that operate to perform the operations.

In the illustrative examples, the hardware may take the form of a circuit system, an integrated circuit, an application specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. Additionally, the processes may be implemented in organic components integrated with inorganic components and may comprise entirely of organic components excluding a human being. For example, the processes may be implemented as circuits in organic semiconductors.

Figure 3:
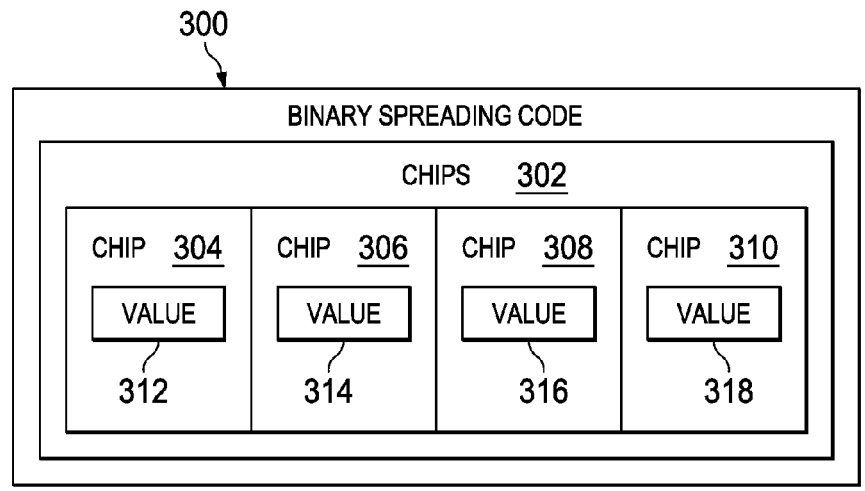
FIG. 3 is an illustration of a block diagram of a binary spreading code in accordance with an illustrative embodiment.

With reference next to FIG. 3, an illustration of a block diagram of a binary spreading code is depicted in accordance with an illustrative embodiment. As depicted, binary spreading code 300 is an example of a component code in component codes 214 in FIG. 2.

In this illustrative example, binary spreading code 300 includes a sequence of chips 302. The sequence of chips 302 includes chip 304, chip 306, chip 308, and chip 310 in this illustrative example. As depicted, chip 302 has value 312, chip 306 has value 314, chip 308 has value 316, and chip 310 has value 318.

In these illustrative examples, value 312, value 314, value 316 and value 318 are selected from at least one of +1, −1, or some other suitable type of value for chips 302 of binary spreading code 300. For example, value 312, value 314, value 316 and value 318 may be selected by at least one of an operator, a source of information being encoded on a transmission over a carrier signal, a binary spreading code generator, a deterministic process, or other suitable type of component in communications environment 200 in FIG. 2.

Figure 4:
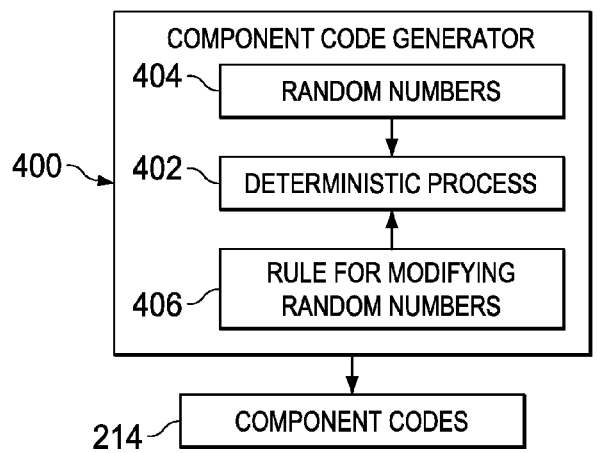
FIG. 4 is an illustration of a block diagram of a component code generator in accordance with an illustrative embodiment.

Turning to FIG. 4, an illustration of a block diagram of a component code generator is depicted in accordance with an illustrative embodiment. As depicted, component code generator 400 is an example of component code generator 212 in FIG. 2. In this illustrative example, component code generator 400 generates component codes 214 in phase table 216 in FIG. 2. For example, component code generator 400 may generate binary spreading code 300 in FIG. 3.

In this illustrative example, component code generator 400 generates component codes 214 using deterministic process 402. In this illustrative example, deterministic process 402 generates component codes 214 from a group of random numbers 404.

A "group of," as used herein with reference to items, means one or more items. For example, a group of random numbers is one or more random numbers. In this example, the group of random numbers 404 may be selected by at least one of an operator, a source of information being encoded on a transmission over a carrier signal, or other suitable types of components in communications environment 200 in FIG. 2.

In the illustrative example, deterministic process 402 always generates the same component code from the same group of random numbers 404. When rule for modifying random numbers 406 and deterministic process 402 are placed in a different location, component code generator 400 can generate the same component code using the same random numbers 404. When the group of random numbers 404 is modified, the deterministic process 402 may then generate a different component code based on the modified group of random numbers 404. For example, after deterministic process 402 generates a first component code in component codes 214, component code generator 400 may modify the group of random numbers 404 using rule for modifying the group of random numbers 406. In this example, component code generator 400 may then use deterministic process 402 to generate another first component code for other component codes. Rule for modifying the group of random numbers 406 is to change the group of random numbers 404 deterministically.

In this illustrative example, after deterministic process 402 generates a first component code in component codes 214, component code generator 400 then generates all remaining component codes in component codes 214 as derivatives of the first component code. For example, component code generator 400 may generate all remaining component codes in component codes 214 based on values of chips in the first component code and symmetrical relationships between phases of a sequence of phases of component codes 214. In this example, the remaining component codes are derived based on making each combination of component codes 214 for each phase of a sequence of phases of component codes 214 unique to the other combinations of component codes of the other phases.

Thus, one of two component code generators at different locations that have the same group of random numbers 404, can use deterministic process 402 to generate a sequence of component codes 214 that matches another sequence of component codes generated by the other of the two component code generators.

The illustration of communications environment 200 and the different components in FIGS. 2-4 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, signal combiner 254 may not be located in signal combining system 202. In this example, signal combiner 254 may be located in a first data processing system and may also be located in a second data processing system.

As another example, at least one of controller 257, component code generator 212, search process 224, or signal combiner 254 may be combined with another suitable component in communications environment 200. In this example, search process 224 may be part of component code generator 212. In this example, search process 224, component code generator 212, or both could be located in signal combining system 202.

As still another example, the illustration of binary spreading code 300 in FIG. 3 is not meant to limit the manner in which other component codes may be implemented. For example, instead of having four chips, binary spreading code 300 may instead include at least one of five chips, six chips or some other suitable number of chips.

Figure 5:
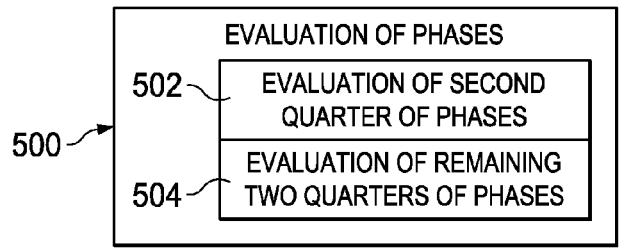
FIG. 5 is an illustration of a block diagram of an evaluation of phases and phase dependencies in accordance with an illustrative embodiment.

Turning to FIG. 5, an illustration of a block diagram of an evaluation of phases and phase dependencies is depicted in accordance with an illustrative embodiment. As depicted, evaluation of phases 500 is an example of an evaluation of sequence of phases 219 in FIG. 2.

In this illustrative example, evaluation of phases 500 includes evaluation of second quarter of phases 502 and evaluation of remaining two quarters of phases 504. For example, when there are sixteen phases in a sequence of phases, remaining two quarters of phases 504 include phases nine through sixteen in the sequence of phases. These evaluations are phase values calculated using symmetrical relationships of the sequence of phases.

For example, once a search process finds the phase values for the first quarter of phases, it may generate evaluation of second quarter of phases 502 based on the phase values of the first quarter of phases and Q-symmetry. In this example, the search process may also generate evaluation of remaining two quarters of phases 504 based on the phase values of the first quarter of phases and Q-symmetry and/or PI-symmetry.

Figure 6:
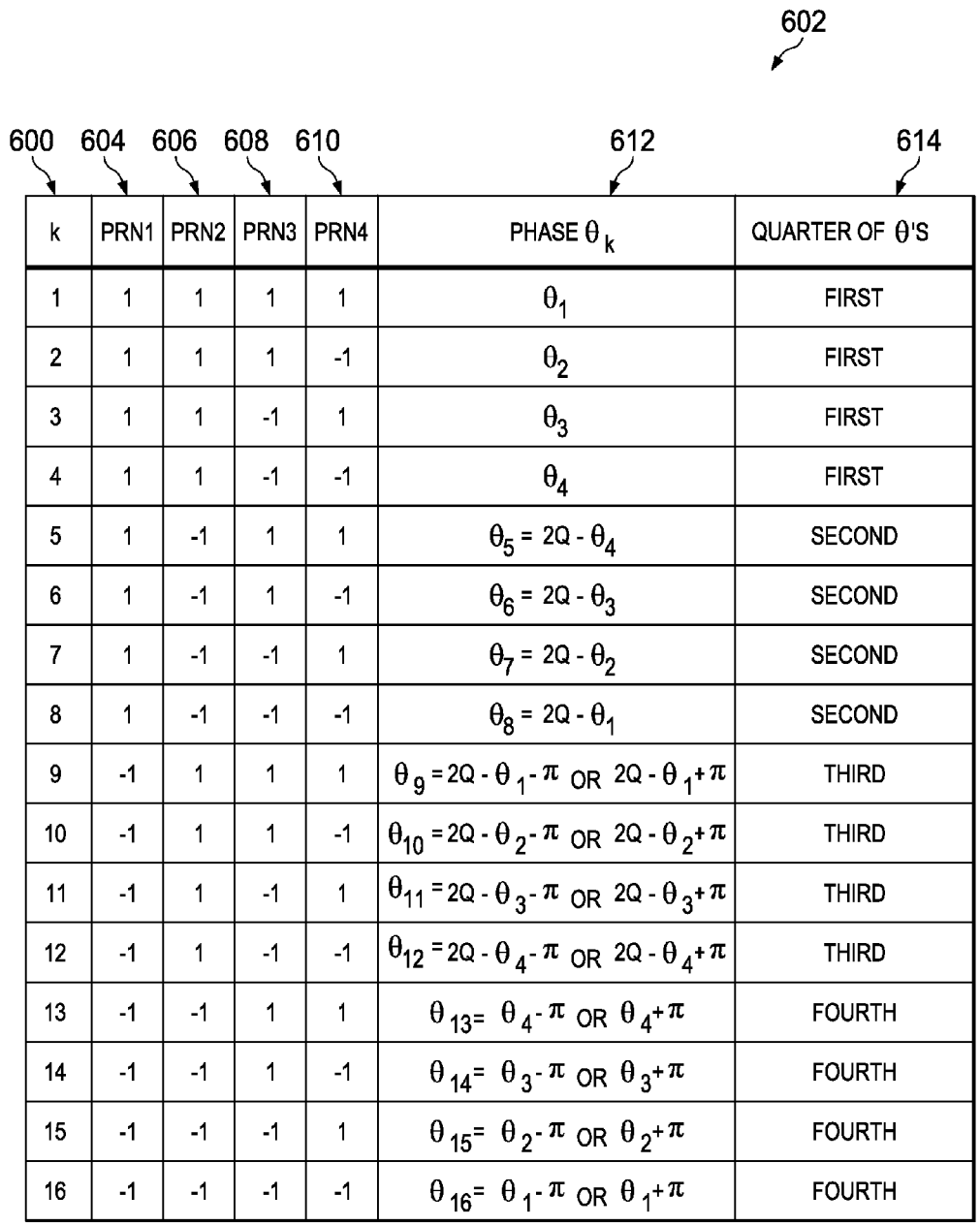
FIG. 6 is an illustration of a phase table of four component codes in accordance with an illustrative embodiment.

Turning now to FIG. 6, an illustration of a phase table of four component codes is depicted in accordance with an illustrative embodiment. As depicted, phase table 600 is an example of phase table 216 in FIG. 2.

In this illustrative example, phase table 600 includes component codes 602. In this illustrative example, component codes 602 is an example of component codes 214 in FIG. 2. Component codes 602 includes pseudo-random noise PRN1 604, pseudo-random noise PRN2 606, pseudo-random noise PRN3 608, and pseudo-random noise PRN4 610 in this illustrative example.

As depicted, rows of phase table 600 depict combinations of component codes for phases. The combinations of component codes for the phases in phase table 600 is an example of combinations of component codes 218 for sequence of phases 219 in FIG. 2.

In this illustrative example, column 612 in phase table 600 shows symmetrical relationships of the phases. The symmetrical relationships of the phases are identified by a search process. The identified symmetrical relationships of the phases are used to reduce a number of independent variables in independent equations.

Column 614 in phase table 600 includes an identification of the quarter of the phases in which each phase is located. In this illustrative example, the first through fourth phase is the first quarter of the phases, the fifth through eighth phases are in the second quarter of the phases, the ninth through twelfth phases are in the third quarter of the phases, and the thirteenth through sixteenth phases are in the fourth quarter of the phases.

For example, the symmetrical relationship between the fifth phase and the fourth phase is shown in column 612 as the equation $\theta_5 = 2Q - \theta_4$, with Q representing Q value, $\theta_5$ representing the phase value of the fifth phase and $\theta_4$ representing the phase value of the fourth phase. This equation means that the fifth phase and the fourth phase are Q-symmetrical to one another. In this illustrative example, after the search process identifies the phase value of the fourth phase and the Q value, the search process then calculates the phase value of the fifth phase with the equation $\theta_5 = 2Q - \theta_4$.

Figure 7:
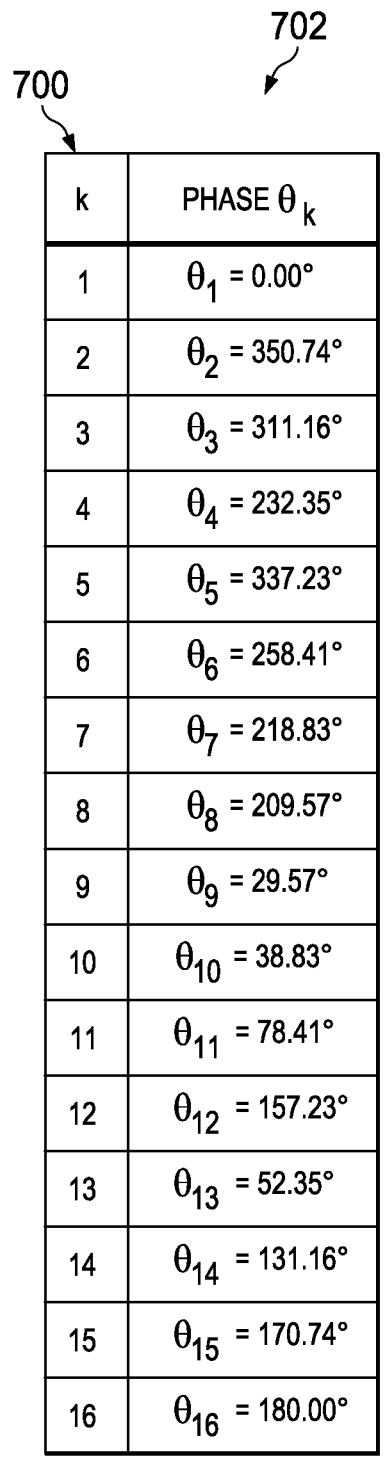
FIG. 7 is an illustration of phase values in accordance with an illustrative embodiment.

Turning next to FIG. 7, an illustration of phase values is depicted in accordance with an illustrative embodiment. As depicted, table 700 includes phase values 702. In this illustrative example, phase values 702 is an example of phase values 222 in FIG. 2. As depicted, each phase value in phase values 702 is a degree of rotation on a unit circle representing the location of the phase on a carrier signal.

Figure 8:
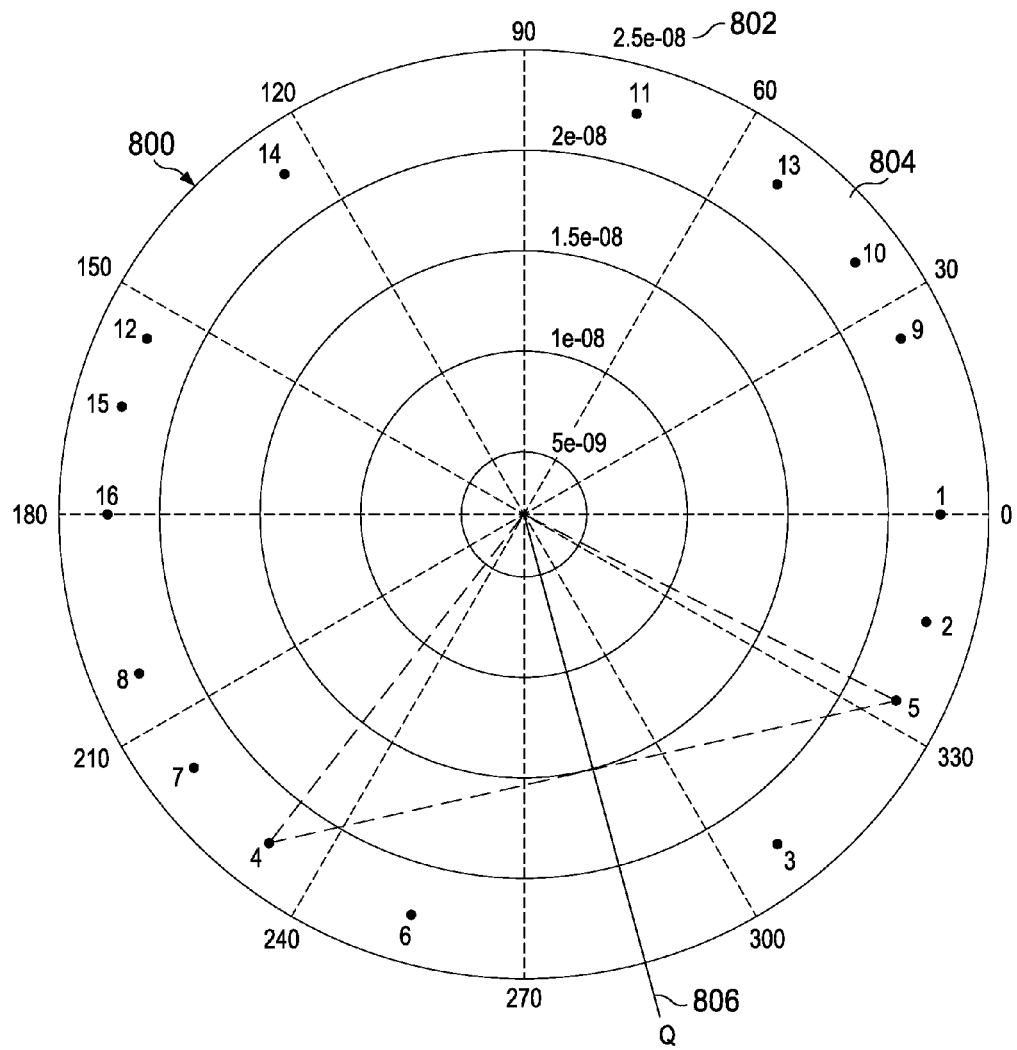
FIG. 8 is an illustration of a constant envelope for four component codes in accordance with an illustrative embodiment.

Turning next to FIG. 8, an illustration of a constant envelope for four component codes is depicted in accordance with an illustrative embodiment. Phase circle 800 is depicted in FIG. 8 as a unit circle of three hundred and sixty (360) degrees. Phase circle 800 includes range of amplitudes 802 of a carrier signal and phase values 804 of sixteen phases. Phase values 804 in FIG. 8 is an example of phase values 222 in FIG. 2.

As depicted, Q value 806 in FIG. 8 is an example of a variable in number of variables 228 in FIG. 2. In this illustrative example, Q value 806 is approximately 280 degrees between the third phase value in phase values 804 and the sixth phase value in phase values 804.

In this illustrative example, phase values 804 are identified by a search process to be at the respective locations shown on the unit circle. The locations of phase values 804 are shown in FIG. 8 as dots. Each dot shown in FIG. 8 has an associated integer next to it identifying the phase number of the phase value in phase values 804. The dot with the number one is the location of the phase value of phase one.

As depicted, the phases are symmetric to one another in various ways. For example, phase one and phase sixteen are pi-symmetrical to one another. In this example, phase one and phase sixteen are half a circle apart. In this illustrative example, pi-symmetry also applies to phase two and phase fifteen, to phase three and phase fourteen.

In this illustrative example, some phases are Q-symmetrical to one another. For example, an isosceles triangle based on Q value 806 is shown in FIG. 8 to show Q-symmetry between phase four and phase five in phase values 804.

Figure 9:
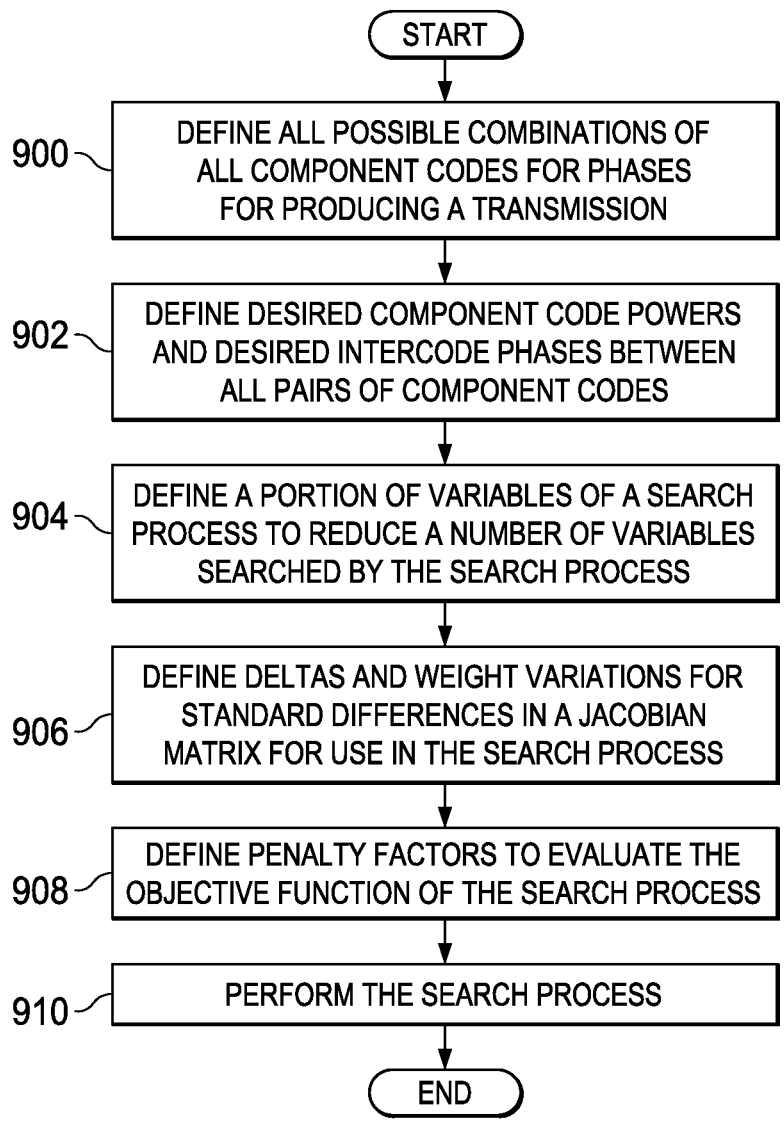
FIG. 9 is an illustration of a flowchart of a process for producing a transmission of constant envelope on a carrier signal in accordance with an illustrative embodiment.

With reference next to FIG. 9, an illustration of a flowchart of a process for producing a transmission of constant envelope on a carrier signal is depicted in accordance with an illustrative embodiment. The process illustrated in FIG. 9 may be implemented in search process 224 in FIG. 2.

The process begins by defining all possible combinations of all component codes for phases for producing a transmission (operation 900). The process also defines desired component code powers and desired intercode phases between all pairs of component codes (operation 902). The process further defines a portion of variables of a search process to reduce a number of variables searched by the search process (operation 904). For example, the process may define a portion of independent variables of independent equations. The process still further defines deltas and weight variations for standard differences in a Jacobian matrix for use in the search process (operation 906). The process even further defines penalty factors to evaluate the objective function of the search process (operation 908).

The process then performs the search process (operation 910), with the process terminating thereafter. Operations 900-910 may be repeated any number of times to produce transmissions of constant envelope on the carrier signal.

For example, when the search process is used with four, five, and six binary spreading codes, the following iterative algorithm may be used to find values for a number of variables of a number of independent equations. In this example, these variables are amplitude, a first quarter of a sequence of phases, and Q value. As another example, a portion of the variables may include at least one of amplitude of the component codes, a first quarter of the phases, or Q value. Once the first quarter of phases is determined, the remaining phases can be calculated via symmetrical relationships of the phases.

In this example, an objective function of the search process is defined as:

$$W(A, \underline{\theta}) = \mu_a \sum_{n=1}^{N} [|corr_n(\underline{\theta})| - corr_{req,n}]^2 + \mu_b \sum_{n=1}^{N-1} \sum_{l=n+1}^{N} \text{Angle}$$
$$[e^{-j\Delta\phi_{n,l}} corr_n(\underline{\theta}) corr_l(\underline{\theta})^*]^2$$
$$= \mu_a \sum_{n=1}^{N} V_n(A, \underline{\theta}, Q) + \mu_b \sum_{n=1}^{N-1} \sum_{l=n+1}^{N} U_{n,l}(A, \underline{\theta}, Q)$$

where the independent component functions in the single summation functions are defined as:

$$V_n(A,\underline{\theta},Q) = [|corr_n(\underline{\theta})| - corr_{req,n}]^2$$

and where the independent component functions in the double summation functions are defined as:

$$U_{n,l}(A,\underline{\theta},Q) = \text{Angle}[e^{-j\Delta\phi_{n,l}} corr_n(\underline{\theta}) corr_l(\underline{\theta})^*]^2$$

where amplitude is shown as 'A' and Q value is shown as 'Q'.

Each of the independent component functions $V_n(A, \underline{\theta}, Q)$ and $U_{n,l}(A, \underline{\theta}, Q)$ consists of a composite signal in this example. Each independent component function is minimized with other independent component functions simultaneously to find optimal values for the number of variables.

In this example, a numerical solution technique to find the amplitude and a set of modulation phases to minimize is included for four binary spreading codes using minimization subroutines requiring evaluation of first derivative partials of each of the independent component functions. Subroutines of the numerical solution technique use a Newton-Gauss method and the first derivative partials are elements in a Jacobian matrix. A standard difference method is used to approximate the first derivatives of the independent component functions. The unknowns to be sought are amplitude, $2^{N-2}$ modulation phases, and Q value in this example.

A global minimum is found using the modulation phases similar to those of quadrature amplitude modulation (QAM) for equivalent numbers of binary spreading codes as a modulation phase initialization. In addition, the initialization also includes an estimate of the amplitude and Q value. In this example, the estimate for the amplitude is the sum of the square roots of powers of all the binary spreading codes being combined, plus 0.7 dB. The estimate for Q value is defined as the average between the first phase of the first quarter of phases and the last phase of the second quarter of phases. The values used for penalty factors are $\mu_a$=1e20 and $\mu_b$=1e30 in this example.

In this example, the search process iterates the following steps until $|\Delta x_k|$ is less than a desired magnitude. In a first step, the search process evaluates $N_v$ independent component functions in the single summation term $\mu_a$ $V_i(A_k, \Phi_k, Q_k)$, i=1:$N_v$. In a second step, the search process evaluates $N_u$ independent component functions in the double summation term $\mu_b$ $U_i(A_k, \Phi_k, Q_k)$, i=1:$N_u$.

In a third step, the search process forms column vector S of size ($N_v$+$N_u$) by 1 where $$S = \begin{bmatrix} \mu_a V_1(A_k \ \underline{\theta}_k \ Q_k) \\ \vdots \\ \mu_a V_{N_v}(A_k \ \underline{\theta}_k \ Q_k) \\ \mu_b U_1(A_k \ \underline{\theta}_k \ Q_k) \\ \vdots \\ \mu_b U_{N_u}(A_k \ \underline{\theta}_k \ Q_k) \end{bmatrix}.$$

In a fourth step, the search process updates delta with weight variation for central standard difference calculations. In a fifth step, the search process evaluates all central standard differences as approximations for first derivative partials as elements in Jacobian matrix $$J = \begin{bmatrix} \frac{\delta V_1}{\delta A} & \frac{\delta V_1}{\delta \theta_1} & \cdots & \frac{\delta V_1}{\delta \theta_{2N/4}} & \frac{\delta V_1}{\delta Q} \\ \vdots & \vdots & \vdots & \vdots & \vdots \\ \frac{\delta V_{N_v}}{\delta A} & \frac{\delta V_{N_v}}{\delta \theta_1} & \cdots & \frac{\delta V_{N_v}}{\delta \theta_{2N/4}} & \frac{\delta V_{N_v}}{\delta Q} \\ \frac{\delta U_1}{\delta A} & \frac{\delta U_1}{\delta \theta_1} & \cdots & \frac{\delta U_1}{\delta \theta_{2N/4}} & \frac{\delta U_1}{\delta Q} \\ \vdots & \vdots & \vdots & \vdots \\ \frac{\delta U_{N_u}}{\delta A} & \frac{\delta U_{N_u}}{\delta \theta_1} & \cdots & \frac{\delta U_{N_u}}{\delta \theta_{2N/4}} & \frac{\delta U_{N_u}}{\delta Q} \end{bmatrix}_{@A_k, \underline{\theta}_k, Q_k}.$$

As a sixth step, the search process then evaluates and collects parameter error estimates $\Delta x_k = -(J^T J)^{-1} J^T S$. In a seventh step, the search process evaluates and collects convergence of parameter error estimates=$J^T S$. An eighth step performed by the search process evaluates and collects parameter estimates $x_{k+1} = x_k + \Delta x_k$ where $x_{k+1}$ contains amplitude, first quarter of phases, and Q value, $\{A_{k+1}, \theta_{1,k+1}, \ldots, \theta_{2N-2,k+1}, Q_{k+1}\}$. After the iterations of these steps of the search process have been completed, the search process then evaluates the second quarter of phases based on Q-symmetry and evaluates the remaining two quarters of phases based on pie-symmetry.

Figure 10:
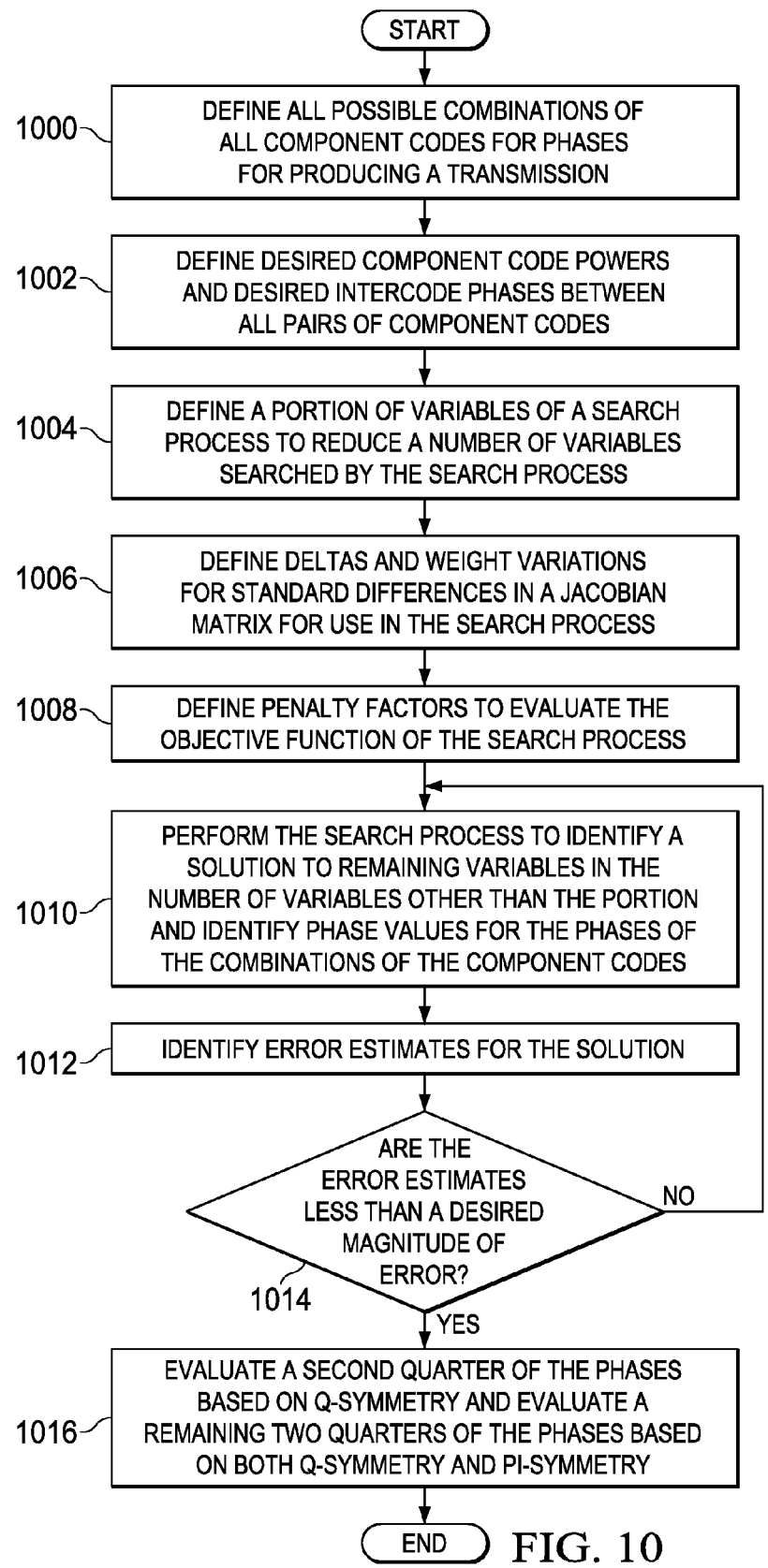
FIG. 10 is an illustration of a flowchart of a process for producing a transmission of constant envelope on a carrier signal in accordance with an illustrative embodiment.

Turning next to FIG. 10, an illustration of a flowchart of a process for producing a transmission of constant envelope on a carrier signal is depicted in accordance with an illustrative embodiment. The process illustrated in FIG. 10 may be implemented in search process 224 in FIG. 2.

The process begins by defining all possible combinations of all component codes for phases for producing a transmission (operation 1000). The process also defines desired component code powers and desired intercode phases between all pairs of component codes (operation 1002). The process further defines a portion of variables of a search process to reduce a number of variables searched by the search process (operation 1004). The process still further defines deltas and weight variations for standard differences in a Jacobian matrix for use in the search process (operation 1006). The process even further defines penalty factors to evaluate the objective function of the search process (operation 1008).

The process next performs the search process to identify a solution to remaining variables in the number of variables other than the portion and identify phase values for the phases of the combinations of the component codes (operation 1010). The process identifies error estimates for the solution (operation 1012). The process then determines whether the error estimates are less than a desired magnitude of error (operation 1014).

As depicted, when the error estimates are not less than the desired magnitude of error, the process goes back to operation 1010. As also depicted, when the error estimates are less than the desired magnitude of error, the process next evaluates a second quarter of the phases based on Q-symmetry and evaluate a remaining two quarters of the phases based on both Q-symmetry and PI-symmetry (operation 1016), with the process terminating thereafter.

Operations 1010-1014 are repeated any number of times until the error estimates are less than the desired magnitude of error. Variables with optimal values upon exiting operation 1014 include at least one of a first quarter of phases, a Q value, an amplitude for transmission or other suitable variables.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

For example, additional operations may be performed in the process illustrated in FIG. 10. In one illustrative example, there may be a limit to the number of times operations 1010-1014 are repeated while the error estimates are not less than the desired magnitude of error.

Figure 11:
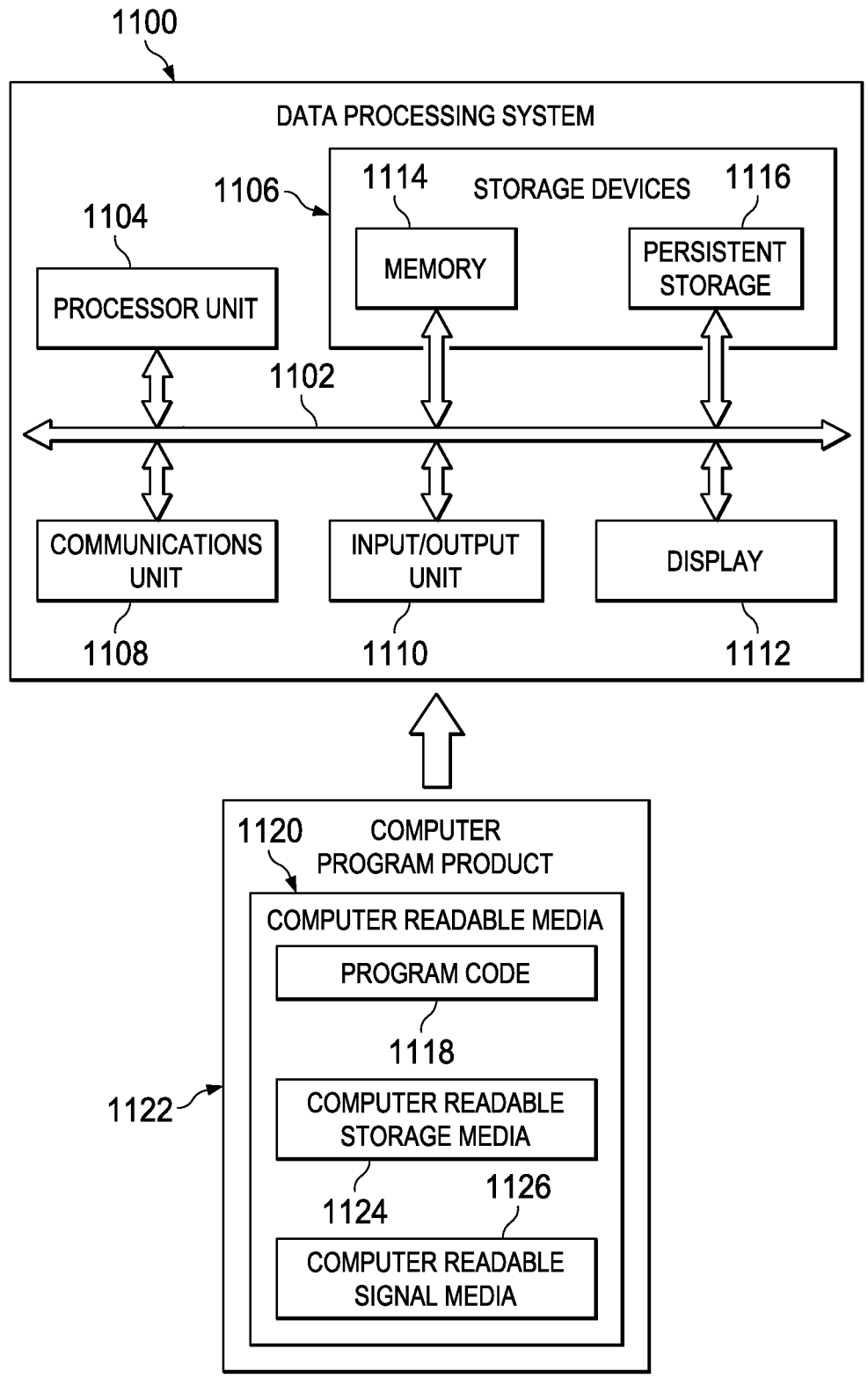
FIG. 11 is an illustration of a block diagram of a data processing system in which an illustrative embodiment may be implemented.

Turning now to FIG. 11, an illustration of a block diagram of a data processing system is depicted in accordance with an illustrative embodiment. Data processing system 1100 may be used to implement component code generator 212, controller 257, search process 224, and signal combiner 254, in signal combining system 202 in FIG. 2, as well as other hardware, or computers that may implement processes in illustrative examples. As depicted, data processing system 1100 includes communications framework 1102, which provides communications between processor unit 1104, storage devices 1106, communications unit 1108, input/output unit 1110, and display 1112. In some cases, communications framework 1102 may be implemented as a bus system.

Processor unit 1104 is configured to execute instructions for software to perform a number of operations. Processor unit 1104 may comprise a number of processors, a multiprocessor core, and/or some other type of processor, depending on the implementation. In some cases, processor unit 1104 may take the form of a hardware unit, such as a circuit system, an application specific integrated circuit (ASIC), a programmable logic device, or some other suitable type of hardware unit.

Instructions for the operating system, applications, and/or programs run by processor unit 1104 may be located in storage devices 1106. Storage devices 1106 may be in communication with processor unit 1104 through communications framework 1102. As used herein, a storage device, also referred to as a computer readable storage device, is any piece of hardware capable of storing information on a temporary and/or permanent basis. This information may include, but is not limited to, data, program code, and other information.

Memory 1114 and persistent storage 1116 are examples of storage devices 1106. Memory 1114 may take the form of, for example, a random access memory or some type of volatile or non-volatile storage device. Persistent storage 1116 may comprise any number of components or devices. For example, persistent storage 1116 may comprise a hard drive, a flash memory, a rewritable optical disk, a rewritable magnetic tape, or some combination of the above. The media used by persistent storage 1116 may or may not be removable.

Communications unit 1108 allows data processing system 1100 to communicate with other data processing systems and devices. Communications unit 1108 may provide communications using physical communications links, wireless communications links, or some combination thereof.

Input/output unit 1110 allows input to be received from and output to be sent to other devices connected to data processing system 1100. For example, input/output unit 1110 may allow user input to be received through a keyboard, a mouse, and/or some other type of input device. As another example, input/output unit 1110 may allow output to be sent to a printer connected to data processing system 1100.

Display 1112 is configured to display information to a user. Display 1112 may comprise, for example, without limitation, a monitor, a touch screen, a laser display, a holographic display, a virtual display device, or some other type of display device.

In this illustrative example, the processes of the different illustrative embodiments may be performed by processor unit 1104 using computer-implemented instructions. These instructions may be referred to as program code, computer usable program code, or computer readable program code and may be read and executed by one or more processors in processor unit 1104.

In these examples, program code 1118 is located in a functional form on computer readable media 1120, which is selectively removable, and may be loaded onto or transferred to data processing system 1100 for execution by processor unit 1104. Program code 1118 and computer readable media 1120 together form computer program product 1122. In this illustrative example, computer readable media 1120 may be computer readable storage media 1124 or computer readable signal media 1126.

Computer readable storage media 1124 is a physical or tangible storage device used to store program code 1118 rather than a medium that propagates or transmits program code 1118. Computer readable storage media 1124 may be, for example, without limitation, an optical or magnetic disk or a persistent storage device that is connected to data processing system 1100.

Alternatively, program code 1118 may be transferred to data processing system 1100 using computer readable signal media 1126. Computer readable signal media 1126 may be, for example, a propagated data signal containing program code 1118. This data signal may be an electromagnetic signal, an optical signal, and/or some other type of signal that can be transmitted over physical and/or wireless communications links.

The illustration of data processing system 1100 in FIG. 11 is not meant to provide architectural limitations to the manner in which the illustrative embodiments may be implemented. The different illustrative embodiments may be implemented in a data processing system that includes components in addition to or in place of those illustrated for data processing system 1100. Further, components shown in FIG. 11 may be varied from the illustrative examples shown.

Thus, the illustrative embodiments provide a method and apparatus for producing a transmission of constant envelope on a carrier signal. One or more illustrative embodiments may use a signal combining system to generate phase values. When a signal combiner uses the generated phase values to modify the carrier signal to transmit combined sequences of bits of information, an increase in power efficiency is achieved for the carrier signal.

The search process in the illustrative embodiments has advantages over the prior art. This search process is faster and uses less processing of resources.

Additionally, the search process can be located in at least one of a computer system that is a source of information being combined on a carrier signal, a tower that sends the information to a satellite or another tower where the carrier signal is transmitted, a tower or satellite where the carrier signal is transmitted, or any other suitable type of platform. Thus, resources are saved in platforms that include the signal combining system when another computer system is used to perform the search process.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for producing a transmission of constant envelope on a carrier signal comprises:
   configuring a transmitter to transmit a carrier signal using a computer system having a processor configured to perform the steps of:
   defining all possible combinations of all component codes for phases for producing the carrier signal in the transmission;
   defining component code powers and intercode phases between all pairs of component codes in the combinations of all component codes using a system of equations having a number of variables;
   defining a portion of variables of a search process to reduce the number of variables searched by the search process;
   performing the search process using a Jacobian matrix to determine values for the portion of the number of variables; and
   defining the component codes using the values for the portion of the number of variables from the search process; and
   transmitting the carrier signal using the component codes that are based on the values, from the transmitter to a destination device.

2. The method of claim 1 further comprising:
evaluating a second quarter of the phases based on Q-symmetry; and
evaluating a remaining two quarters of the phases based on both the Q-symmetry and PI-symmetry.

3. The method of claim 1, wherein the portion of variables includes at least one of amplitude of the component codes, a first quarter of the phases, and Q value.

4. The method of claim 3, wherein the amplitude of the component codes is a sum of the component code powers plus about 0.7 dB.

5. The method of claim 1, wherein the step of performing the search process comprises:
identifying a solution to remaining variables in the number of variables other than the portion; and
identifying phase values for the phases for producing the transmission.

6. The method of claim 5, wherein the step of performing the search process comprises:
identifying error estimates for the solution.

7. The method of claim 6 further comprising:
repeating the search process until the error estimates are less than a magnitude of errors.

8. The method of claim 1, wherein the component codes are binary spreading codes.

9. The method of claim 8, wherein the binary spreading codes are sequences of chips, wherein values of the chips are either +1 or −1 randomly selected via a deterministic process.

10. The method of claim 1, wherein the number of variables of the search process are independent variables of independent equations used in the search process, and wherein the step of defining a portion of independent variables of independent equations of the search process to reduce a number of independent variables reduces the number of independent variables of the independent equations of the search process to where the number of independent equations is greater than the number of independent variables being searched by the search process.

11. A system comprising:
a tower configured to transmit a carrier signal to a satellite using a signal combining system comprising:
a component code generator configured to define all possible combinations of all component codes for phases for producing a transmission of information on the carrier signal with a constant envelope;
a computer system having a processor, the processor, as part of a search process, configured to:
identify phase values for the phases for producing the transmission;
define component code powers and intercode phases between all pairs of component codes in the combinations of all component codes using a system of equations having a number of variables;
define a portion of variables of the search process to reduce the number of variables searched by the search process;
perform the search process using a Jacobian matrix to determine values for the portion of the number of variables; and
define the component codes using the values for the portion of the number of variables from the search process; and
transmit the signal using the component codes that are based on the values, to the satellite.

12. The system of claim 11, wherein the processor, as part of the search process, is configured to evaluate a second quarter of the phases based on Q-symmetry; and evaluates a remaining two quarters of the phases based on both the Q-symmetry and PI-symmetry.

13. The system of claim 11, wherein the portion of variables includes at least one of amplitude of the component codes or a first portion of the phases.

14. The system of claim 13, wherein the amplitude of the component codes is a sum of the component code powers plus about 0.7 dB.

15. The system of claim 11, wherein the processor, as part of the search process, is configured to identify a solution to remaining variables in the number of variables other than the portion of variables.

16. An apparatus comprising:
a satellite configured to transmit a carrier signal to a tower using a signal combining system comprising:
a component code generator configured to define all possible combinations of all component codes for phases for producing a transmission of information on the carrier signal with a constant envelope;
a computer system comprising a processor, the processor unit, as part of a search process, configured to:
identify phase values for the phases for producing the transmission;
define component code powers and intercode phases between all pairs of component codes in the combinations of all component codes using a system of equations having a number of variables;
define a portion of variables of the search process to reduce the number of variables searched by the search process;
perform the search process using a Jacobian matrix to determine values for the portion of the number of variables; and
define the component codes using the values for the portion of the number of variables from the search process; and
transmit the signal using the component codes that are based on the values, to the tower.

17. The apparatus of claim 16, wherein the processor, as part of the search process, is configured to evaluate a second quarter of the phases based on Q-symmetry; and evaluates a remaining two quarters of the phases based on both the Q-symmetry and PI-symmetry.

18. The apparatus of claim 16, wherein the portion of variables includes at least one of amplitude of the component codes or a first portion of the phases.

19. The apparatus of claim 18, wherein the amplitude of the component codes is a sum of the component code powers plus about 0.7 dB.

20. The apparatus of claim 16, wherein the processor, as part of the search process, is configured to identify a solution to remaining variables in the number of variables other than the portion of variables.

* * * * *